United States Patent
Li et al.

(10) Patent No.: US 11,044,113 B2
(45) Date of Patent: Jun. 22, 2021

(54) MOCA CONNECTIVITY SPLITTER AND HUB

(71) Applicant: CommScope, Inc. of North Carolina, Hickory, NC (US)

(72) Inventors: Shi Man Li, Mooresville, NC (US); Mark O. Vogel, Statesville, NC (US)

(73) Assignee: CommScope, Inc. of North Carolina, Hickory, NC (US)

( * ) Notice: Subject to any disclaimer, the term of this patent is extended or adjusted under 35 U.S.C. 154(b) by 81 days.

(21) Appl. No.: 16/368,852

(22) Filed: Mar. 28, 2019

(65) Prior Publication Data

US 2019/0312744 A1 Oct. 10, 2019

Related U.S. Application Data

(60) Provisional application No. 62/655,078, filed on Apr. 9, 2018.

(51) Int. Cl.
| | |
|---|---|
| *H04L 12/28* | (2006.01) |
| *H03H 7/48* | (2006.01) |
| *H01P 5/18* | (2006.01) |
| *H01R 24/54* | (2011.01) |
| *H03H 7/01* | (2006.01) |
| *H01R 103/00* | (2006.01) |

(52) U.S. Cl.
CPC ............ *H04L 12/2801* (2013.01); *H01P 5/18* (2013.01); *H01R 24/547* (2013.01); *H03H 7/0138* (2013.01); *H03H 7/48* (2013.01); *H01R 2103/00* (2013.01)

(58) Field of Classification Search
CPC ..... H04L 12/2801; H01P 5/18; H01R 24/547; H01R 2103/00; H03H 7/48; H03H 7/0138
USPC ......................................................... 333/112
See application file for complete search history.

(56) References Cited

U.S. PATENT DOCUMENTS

| | | |
|---|---|---|
| 3,676,744 A | 7/1972 | Pennypacker |
| 6,969,278 B2 | 11/2005 | Shapson |
| 7,310,355 B1 | 12/2007 | Krein et al. |
| 7,530,091 B2 | 5/2009 | Vaughan |
| 8,397,271 B2 | 3/2013 | Riggsby |
| 8,429,695 B2 | 4/2013 | Halik et al. |
| 8,695,055 B2 | 4/2014 | Labro |
| 8,752,114 B1 | 6/2014 | Shapson et al. |
| 8,810,334 B2 | 8/2014 | Rijssemus |
| 9,167,286 B2 | 10/2015 | Wells et al. |
| 9,209,774 B2 | 12/2015 | Rijssemus |
| 9,356,796 B2 | 5/2016 | Shapson et al. |
| 9,516,376 B2 | 12/2016 | Wells et al. |
| 9,699,516 B2 | 7/2017 | Li |
| 9,743,038 B2 | 8/2017 | Li |
| 2005/0044573 A1 | 2/2005 | Preschutti |

(Continued)

*Primary Examiner* — Robert J Pascal
*Assistant Examiner* — Kimberly E Glenn
(74) *Attorney, Agent, or Firm* — Muncy, Geissler, Olds & Lowe, P.C.

(57) ABSTRACT

The present invention is directed to a splitter or hub that provides plural ports for communicating MoCA signals between devices. More particularly, the present invention relates to a passive splitter to communicate MoCA signals between a gateway/amplifier port and customer devices, or a passive hub to communicate MoCA signals between customer devices. The splitter or hub includes a resistive splitter network and may include a MoCA passing filter and a test port.

20 Claims, 7 Drawing Sheets

(56) References Cited

U.S. PATENT DOCUMENTS

| | | |
|---|---|---|
| 2006/0205442 A1 | 9/2006 | Phillips et al. |
| 2008/0120667 A1 | 5/2008 | Zaltsman |
| 2008/0148325 A1 | 6/2008 | Robertson et al. |
| 2009/0320086 A1 | 12/2009 | Rijssemus et al. |
| 2013/0081096 A1 | 3/2013 | Wells et al. |
| 2013/0181789 A1 | 7/2013 | Rijssemus et al. |
| 2015/0288920 A1 | 10/2015 | Li |
| 2017/0302883 A1 | 10/2017 | Li |
| 2018/0288491 A1* | 10/2018 | Shapson ............... H04N 7/102 |

\* cited by examiner

//MOCA CONNECTIVITY SPLITTER AND HUB

This application claims the benefit of U.S. Provisional Application No. 62/655,078, filed Apr. 9, 2018, which is herein incorporated by reference.

BACKGROUND OF THE INVENTION

1. Field of the Invention

The present invention is directed to a splitter or hub that provides plural ports for communicating MoCA signals between devices. More particularly, the present invention relates to a passive splitter to communicate MoCA signals between a gateway port and customer devices, or a passive hub to communicate MoCA signals between customer devices.

2. Description of the Related Art

Cable television ("CATV") networks are known types of communications networks that are used to transmit information between a service provider and a plurality of subscriber premises, typically over fiber optic and/or coaxial cables. The service provider may offer, among other things, cable television, broadband Internet and Voice-over-Internet Protocol ("VoIP") digital telephone service to subscribers within a particular geographic area. The service provider transmits "forward path" or "downstream" signals from the headend facilities of the cable television network to the subscriber premises. "Reverse path" or "upstream" signals may also be transmitted from the individual subscriber premises back to the headend facilities. In the United States, the forward path signals are typically transmitted in the 54-1,002 MHz frequency band, and may include, for example, different tiers of cable television channels, movies on demand, digital telephone and/or Internet service, and other broadcast or point-to-point offerings. The reverse path signals are typically transmitted in the 5-42 MHz frequency band and may include, for example, signals associated with digital telephone and/or Internet service and ordering commands, i.e., for movies-on-demand and other services.

Each subscriber premises typically includes one or more power divider networks that are used to divide the downstream signals received from the service provider, so that the downstream signals may be fed to a plurality of service ports, such as wall outlets that are dispersed throughout the subscriber premises. These power divider networks also combine upstream signals that may be transmitted from one or more of the service ports into a composite upstream signal that is transmitted over the CATV network back to the headend facilities, e.g., in the 5-42 MHz frequency band.

A recent trend is to use the coaxial cables that are installed throughout most homes, apartments and other subscriber premises as an "in-premises" or "in-home" network that may be used to transmit signals from a first end device that is connected to a first wall outlet in a subscriber premises to other end devices that are connected to other wall outlets in the same subscriber premises. An industry alliance known as the Multi-media Over Coax Alliance ("MoCA") has developed standards which specify frequency bands, interfaces and other parameters that will allow equipment from different standards-compliant vendors to be used to distribute multi-media content over such in-premises coaxial cable networks. These standards specify that such "MoCA" content is transmitted over the in-premises coaxial cable network works in the 400 MHz to 1,675 MHz frequency band, although some service providers only distribute MoCA content within a narrower frequency band that is above the cable television band, such as, for example, the 1,125 MHz to 1,675 MHz frequency band. Thus, the MoCA content is transmitted over the in-premises network in a pre-selected MoCA frequency band. The power divider network in the in-premises network may be designed to support communications between its output ports in this pre-selected MoCA frequency band.

Examples of MoCA content that may be distributed over an in-premises coaxial cable network are digital television, video-on-demand programming and digitally-recorded television or music programming. In an exemplary application, such programming may be transmitted via the in-premises network of a home from a primary set-top box (which may be a full service set top box having a digital television receiver, DVR and/or video-on-demand capabilities, etc.) to less capable, less expensive, auxiliary set-top boxes that are installed on other televisions throughout the premises or directly to televisions, DVD players, etc. with MoCA ports. In this manner, the full capabilities of the primary set top box may be enjoyed at all of the televisions within the residence without having to provide a primary set top box for each television.

Also, it is known to connect a gateway device to the downstream/upstream CATV signal, and then connect the gateway device to other devices, such as laptop computers, desktop computers, TVs, monitors, security cameras, intercoms, internet interface assistants, wireless light controllers, etc., via the MoCA ports using the in-premises network.

In many cases, significant attenuation may occur as signals are passed through the cable television network of a service provider, and hence the power level of the RF signal that is received at a subscriber premises may be on the order of 0-5 dBmV/channel. Such received signal levels may be insufficient to support the various services at an acceptable quality of service level. Accordingly, an RF signal amplifier may be provided at or near an entrance point of an individual subscriber's premises. The RF signal amplifier is used to amplify the downstream RF signals to a more useful level. The RF signal amplifier may also be configured to amplify the upstream RF signals that are transmitted from the subscriber premises to the headend facilities of the cable television network. Typically, the RF signal amplifiers are incorporated into the power divider network as the first unit, which takes the form of a powered bi-directional RF signal amplifier with an input port for receiving a coaxial cable from the service provider side and plural output ports which receive coaxial cables connected to the various service ports, such as the wall outlets that are dispersed throughout the subscriber's premises.

In accordance with the known power divider network unit, a RF signal amplifier receives a composite downstream RF signal of approximately 5 dBmV/channel in the range of approximately 54-1,002 MHz comprising information for telephone, cable television (CATV), Internet, VoIP, and/or data communications from a service provider. The RF signal amplifier may increase this downstream signal to a more useful level of approximately 20 dBmV/channel at each output port of the unit and pass the amplified downstream signal to one or more devices in communication with the RF signal amplifier through connections to the various coaxial wall outlets. Such devices may include, but need not be limited to: televisions, modems, telephones, computers, and/or other communications devices known in the art. In the event of power failure, unamplified signals may still be passed (in both directions) through a passive communications path between the service provider and at least one communications device.

FIG. 1 illustrates a high level schematic of a bi-directional RF signal amplifier 100 according to the background art. More information concerning the bi-directional RF signal amplifier 100 can be found in the Assignee's U.S. Pat. No. 9,699,516, granted Jul. 4, 2017, the entire contents of which are herein incorporated by reference.

The RF signal amplifier 100 includes a plurality of RF output ports 181-188 that may be used to pass downstream and upstream signals between a service provider and multiple communications devices located in the subscriber premises when the RF signal amplifier is powered and operating normally. Moreover, RF signal amplifier 100 further includes a non-interruptible RF output port 189 that may be used to maintain bi-directional RF communications even during power outages.

As shown in FIG. 1, RF signal amplifier 100 includes a bi-directional RF input port 105 for receiving downstream RF signals from a service provider, or any other appropriate signal source. RF input port 105 can also pass upstream signals in the reverse direction from the RF signal amplifier 100 to the service provider. Due to the bi-directional nature of communications through RF signal amplifiers, it will be appreciated that an "input" port will act as an "output" port and an "output" port will act as an "input" port if the direction of signal flow is reversed. Consequently, it will be appreciated that the terms "input" and "output" are used herein solely for purposes of distinguishing various ports from one another, and are not used to require a direction of signal flow.

As noted above, RF signal amplifier 100 further includes a plurality of bi-directional output ports 181-189 that may be used to pass downstream RF signals from the RF signal amplifier 100 to one or more devices in communication with the output ports 181-189, and to receive upstream RF signals from those devices so that they may be passed through the RF signal amplifier 100 to the service provider. It will be appreciated that any appropriate device that may advantageously send and/or receive an RF signal may be placed in communication with one or more of the various output ports 181-189. For example, it is contemplated that telephone, CATV, Internet, VoIP, and/or data communication devices may be placed in such communication with a service provider where the RF signal amplifier 100 is installed in the residence of a subscriber. However, it will further be appreciated that any desired combination of these and/or other devices may be used where appropriate.

Signals received through RF input port 105 can be passed through RF signal amplifier 100 via an active communications path 114 that extends between RF input port 105 and RF output ports 181-188 and/or 189. Specifically, the downstream signals that are received at RF input port 105 from the service provider are passed to a passive directional coupler 110 that has a first output port that connects to the active communications path 114 and a second output port that connects to a passive communications path 118. The directional coupler 110 splits downstream RF signals onto the active communications path 114 and the passive communications path 118. It will be appreciated that the directional coupler 110 may either evenly or unevenly split the power of the downstream signals between the communications paths 114, 118, depending on the design of the overall circuit. The active communications path 114 amplifies at least one of downstream signals from the service provider to the subscriber premises or upstream signals from the subscriber premises to the service provider. The passive communications path 118 acts as a "non-interruptible" communications path that has no active components thereon, which allows downstream and/or upstream signals to traverse the passive communications path 118 even if a power supply to the RF signal amplifier 100 is interrupted. In some embodiments, the passive communications path 118 may provide a communications path for VoIP telephone service that will operate even during power outages at the subscriber premises (assuming that the modem and/or telephone, as necessary, are powered by a battery backup unit).

As is further shown in FIG. 1, downstream signals traversing the active communications path 114 pass from the first output of directional coupler 110 to an input port of a switching device such as, for example, an SPDT non-latching relay 120. A first output 122 of the relay 120 is connected to an input of a high/low diplexer 130. A second output 124 of the relay 120 is connected to a resistor 126, such as a 75 ohm resistor connected between the second output 124 and ground.

The diplexer 130 separates the high frequency downstream signal from any low frequency upstream signals incident in the reverse direction. In various embodiments, diplexer 130 can filter the signals in a manner such that signals with frequencies greater than approximately 45-50 MHz are passed as high frequency downstream signals, while signals with frequencies lower than such range are passed in the reverse direction as low frequency upstream signals received from ports 181-188. It will be appreciated, however, that other diplexer designs may be utilized.

The high frequency downstream signals filtered by diplexer 130 can be amplified by individual power amplifier 140, and passed through a second high/low diplexer 150 to a MoCA rejection filter 160. MoCA rejection filter 160 attenuates any frequencies in the MoCA frequency range. Typically, no signals in the downstream direction will contain MoCA frequencies and hence the downstream signal will be unaffected.

Next, the downstream signal passes to an input 169 of a power divider network 170. The power divider network 170 splits the downstream signal so that it may be distributed to each of ports 181-188. In the embodiment of FIG. 1, the power divider network 170 includes a power divider 171 in a first tier, feeding power dividers 172 and 173 in a second tier, feeding power dividers 174, 175, 176 and 177 in a third tier. The first, second and third tiers form a pyramid structure. While the power divider network 170 illustrated in FIG. 1 splits the downstream signals for distribution to eight different ports, it will be appreciated that the power divider network 170 may split the downstream signals for distribution to different numbers of ports (e.g., four, six, ten, etc.).

Turning now to the reverse (upstream) signal flow through the active communications path 114 of RF signal amplifier 100, upstream signals received by the RF signal amplifier 100 from devices in communication with ports 181-188 are passed to power divider network 170 where they are combined into a composite upstream signal. This composite upstream signal is fed out of input 169 through the MoCA rejection filter 160. The MoCA rejection filter 160 attenuates frequencies in the MoCA frequency range so as to prevent the MoCA signaling, which freely traverses between the ports 181-188, from entering the high/low diplexer 150. The high/low diplexer 150 separates the low frequency composite upstream signal from any high frequency downstream signals incident in the forward direction. As previously discussed in relation to diplexer 130, the diplexer 150 can filter the signals such that signals with frequencies greater than approximately 45-50 MHz are passed in the forward direction as high frequency downstream signals, while signals with frequencies lower than such range are passed in the reverse direction as low frequency upstream signals received from ports 181-188.

The composite low frequency upstream signal, filtered by diplexer 150, can be passed directly to high/low diplexer 130 (or optionally the upstream signal, filtered by the diplexer 150, can pass through an upstream power amplifier 142 prior to reaching the diplexer 130), where it is then passed through the first output port 122 of the non-latching SPDT relay 120 to the first output port of the directional coupler 110. The directional coupler 110 combines the upstream signal received at output port 122 with any upstream signal received from the passive communications path 118 and passes this combined signal to the RF input port 105 for output to a service provider or other entity in communication with RF input port 105.

The power amplifiers 140 and 142 that are included on the active communications path 114 are active devices that must be powered via a power source, such as a DC linear regulator 195 that outputs a power supply voltage VCC. During normal operation, the RF signal amplifier 100 can be powered from a power input port 190 and/or power that is reverse fed through one of the RF output ports (e.g., output port 188, which is labeled "VDC IN"). In a typical installation at a subscriber premises, it is contemplated that RF signal amplifier 100 may be powered by an AC/DC adapter receiving power provided by the residence (for example, 100-240 VAC, 50/60 Hz). As illustrated in FIG. 1, the power received from either power input 190 or power input 188 may be provided to the DC voltage regulator 195 which supplies an operating voltage VCC to the power amplifiers 140 and 142 and the relay 120.

In the event that power to the DC voltage regulator 195 is interrupted, DC voltage regulator 195 will be unable to provide operating voltage VCC to power amplifiers 140 and 142 and relay 120. Consequently, during power outages, the downstream portion (and also the upstream portion, if the upstream power amplifier 142 is employed) of the active communications path 114 will be lost, and the relay 120 will connect the resistor 126 to the first output of directional coupler 110.

As noted above, RF signal amplifier 100 also has the passive communications path 118 that extends from the second output of the directional coupler 110 to the port 189. This passive communication path 118 bypasses the power amplifiers 140 and 142 and does not include any active components. Consequently, the passive communications path 118 will remain available to pass communications between port 105 and port 189, even when the power supply to RF signal amplifier 100 is interrupted. Accordingly, the passive communications path 118 is also referred to as a "non-interruptible" communications path. The passive communications path 118 may be used to maintain essential services to the subscriber premises such as, for example, 911 emergency lifeline services, even during power outages, so long as the subscriber has a battery backup for the necessary devices connected to port 189.

The passive communications path 118 is connected to the active communications path 114 at the input 169 of the power divider network 170. Within the passive communication path 118, upstream signals from the port 189 pass into an input 168 of a diplexer 162. Signals in the MoCA frequency range exit the diplexer 162 via output 164 and pass to the active communication path directly upstream of the power divider network 170. By this arrangement, MoCA signals from the port 189 may enter the input 169 of the power divider network 170. Hence, MoCA signals may be passed between all of the devices connected to ports 181-189.

The signals from the port 189 which pass into the input 168 of a diplexer 162, which are in the high/low frequency range for downstream and upstream communication with the service provider exit the diplexer 160 via output 166 and pass to the second output of the directional coupler 110, where the signals are combined with the signals on the active communication path 114 and are then passed to the port 105.

Additional background art can be found in U.S. Pat. Nos. 3,676,744; 6,969,278; 7,310,355; 7,530,091; 8,695,055; 8,752,114; 8,810,334; 9,167,286; 9,209,774; 9,356,796 and 9,516,376, and in US Published Application Nos. 2005/0044573; 2006/0205442; 2008/0120667; 2008/0148325; 2009/0320086; 2013/0081096 and 2015/0288920, which are herein incorporated by reference.

SUMMARY OF THE INVENTION

The Applicant has appreciated some drawbacks in the RF signal amplifier 100 of FIG. 1. One drawback is that the downstream signal from the service provider must be provided to the port 105 at a relative high power level, or the downstream amplifier 140 must be made rather robust and will consume a high level of power, if the CATV signal is to be provided at each of the ports 181-188 at a power level sufficient to provide a high quality of service. In other words, assuming that each power divider 171-177 is set to split the incoming signal power to 50% going to each output leg, the CATV signal entering the input of the power divider 170 will be reduced by at least 87.5% before it reaches the port 181. Assuming no losses in the power dividers 171-177, each of the eight ports 181-188 will present, at best, 12.5% of the signal power level initially input into power divider network 170.

The Applicant has appreciated that it is common in household installations that not every coaxial outlet in the household needs to be prepared for CATV downstream signal feeds. Rather, many of the coaxial outlets are simply used for MoCA devices. For example, a typical household might need only one, two, or at most three, coaxial outlets with CATV downstream and upstream signaling abilities. Most houses seem to have one of the expensive set top boxes with DVR abilities and a modem for internet communications. Other outlets in the house might only need MoCA abilities. For example, a TV that is used to watch recorded events from the DVR, a computer that interacts with the modem for internet access, a VoIP phone that interacts with the modem, a gaming station that only interacts with another gaming station at another wall outlet, etc.

Further, often times the signal strength of the downstream signal from the service provider is sufficient to power one, two or even three CATV downstream signal feeds within a household without the need of an amplifier within the customer's premises. Even if the signal strength of the downstream signal from the service provider is not sufficient to power two or three CATV downstream signal feeds, the amplifier capacity and power consumption does not need to be so large as to power eight CATV output ports (as shown in FIG. 1), when only two or three CATV output ports are needed in the customer's premises. To this end, a smaller device 11, like a passive gateway device, active gateway device or a RF signal amplifier, as shown in FIG. 2 may be provided at the customer's premises. The smaller device 11 has an input port 13 for communicating signals with a service provider line, two RF/MoCA ports 15 and 17, and a single "MoCA only" port 19. The smaller device 11 may also include a power port 21, in the case of a RF signal amplifier or active gateway device, where the signal to the two RF/MoCA ports needs to be amplified to be useable.

Also, the MoCA alliance has established the MoCA frequency band to be 400 MHz to 1,675 MHz. Due to conflicts with CATV signaling, the usable MoCA frequency band is narrower in the device of FIG. 1, such as about 1,125 MHz to 1,675 MHz. The reduced MoCA frequency band can impose limits on the speed and/or volume of signaling between the customer devices in the subscriber's premises.

Therefore, the Applicant has appreciated a new device, which functions in combination with a gateway device, or amplifier having one or more RF/MoCA output ports. The device functions as a passive splitter and strips away the CATV RF signal and provides plural ports for communicating MoCA signals between the CATV/MoCA output port and plural devices in the subscriber's premises. Alternatively, the device may be attached to a "MoCA only" port of the gateway or amplifier and provide plural ports for communicating MoCA signals between the "MoCA only" port and plural devices in the subscriber's premises. Further, the device may act as a passive hub for communicating MoCA signals between plural devices in the subscriber's premises, with no connection to a gateway or amplifier port.

By keeping the MoCA signaling isolated from the CATV signals, the full range of MoCA signaling, e.g., 400 MHz to 1,675 MHz, may be used by the devices within the subscriber's premises without inference with the CATV signal.

Also, the passive splitter or passive hub may include a test port to monitor the MoCA signaling by a technician and troubleshoot any in-home network problems. The test port has a high isolation, e.g., 20 dbs or greater, from the MoCA ports and therefore does not significantly reduce the signal strength of the MoCA signals passing between the ports. In one embodiment, the test port is coupled to one or more of the MoCA ports by a directional coupler. In one embodiment, the test port is configured differently relative to the MoCA ports, so as to reduce confusion by the end user, so that the test port is not accidentally used as a MoCA port for a customer device within the subscriber's premises.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF EMBODIMENTS OF THE INVENTION

Figure 1:
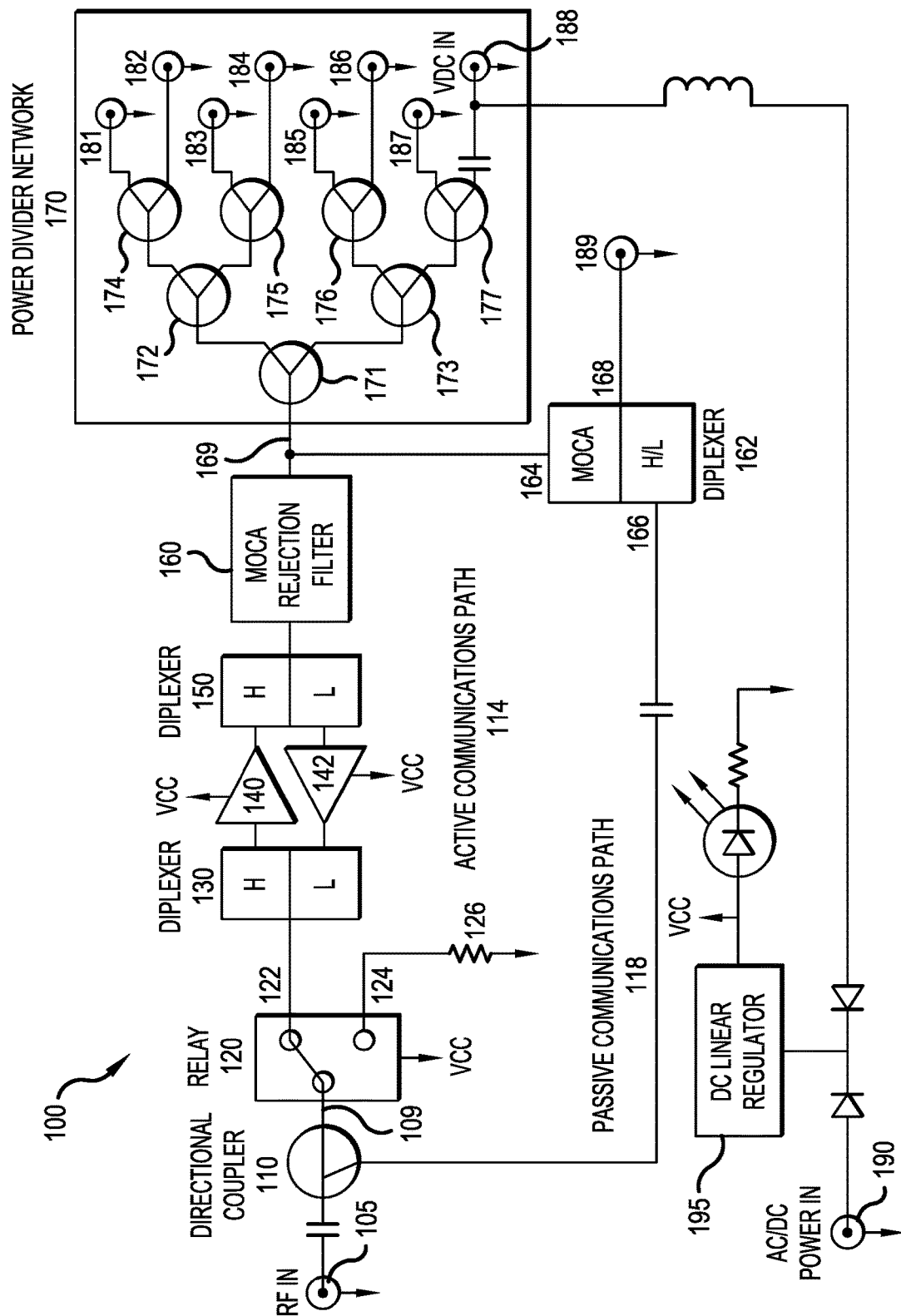
FIG. 1 is a high level schematic of a bi-directional RF signal amplifier, in accordance with the background art.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 2:
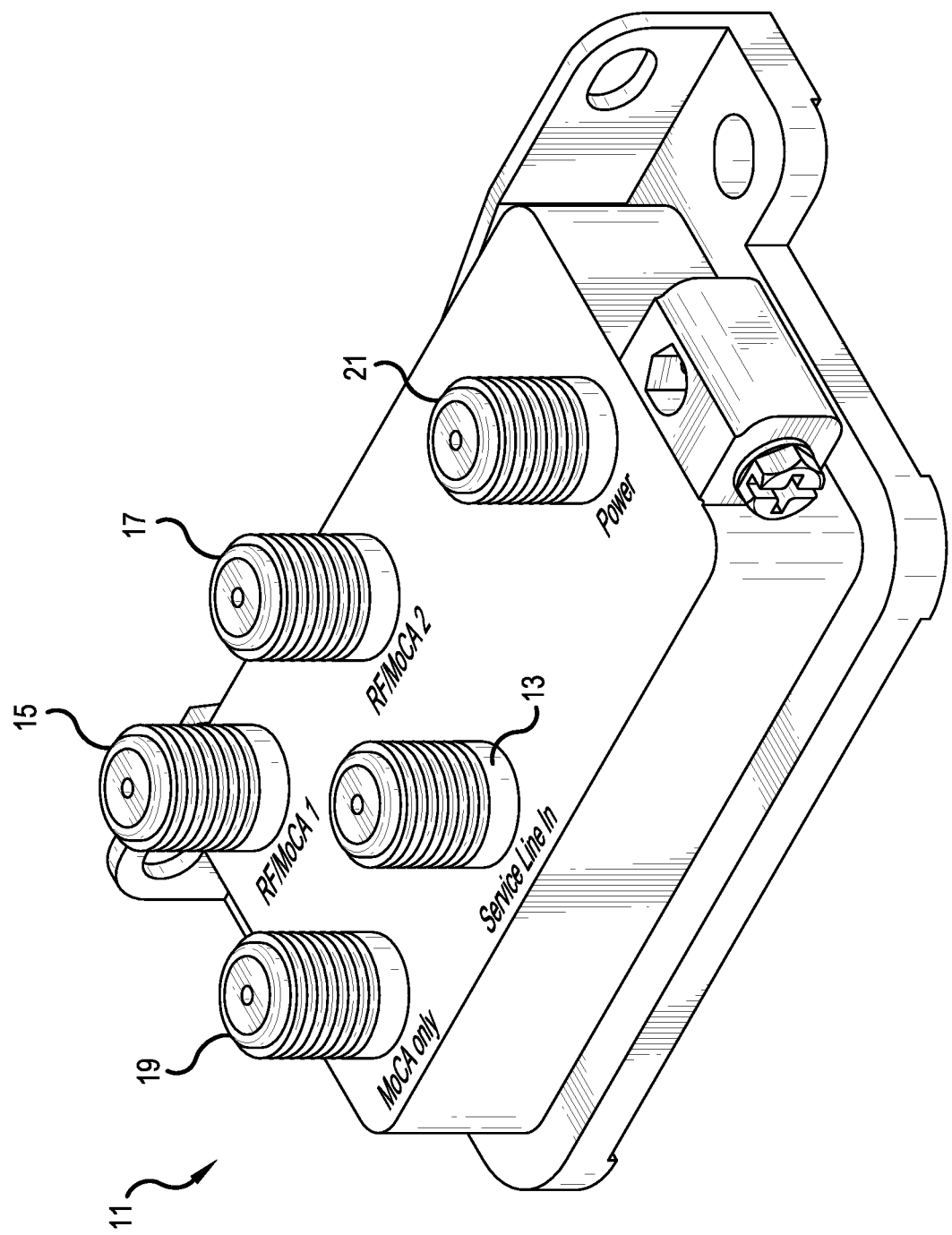
FIG. 2 is a perspective view of a gateway device or RF signal amplifier device having two RF/MoCA ports and one "MoCA only" port.
Figure 3:
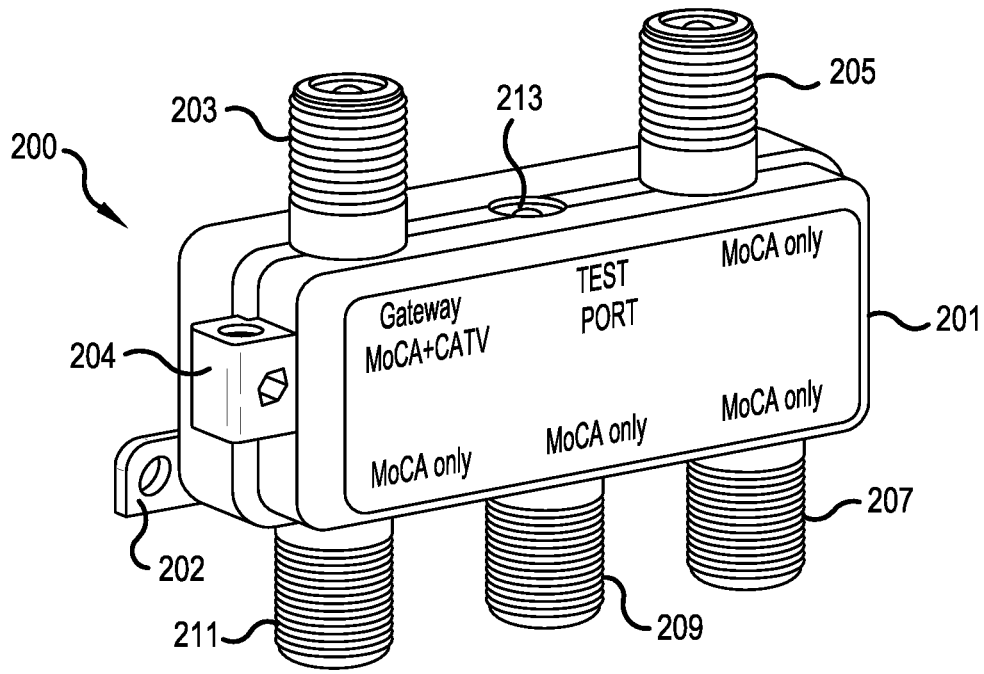
FIG. 3 is a perspective view of a housing of a passive in-home network device, in accordance with a first embodiment of the present invention.

FIG. 3 is a perspective view of a passive in-home network device 200 in accordance with a first embodiment of the present invention. The device 200 includes a housing 201. The housing 201 includes a female coaxial input port, or first port 203. The first port 203 is provided for attachment to a RF/MoCA port of an RF signal amplifier device, an active gateway device or a passive gateway device. For example, the first port 203 may be connected to one of ports 15 or 17 of the device 11 of FIG. 2 by a coaxial cable.

The housing 201 may include one or more mounting brackets 202. Further, the housing 201 may include a grounding block 204.

Second, third, fourth and fifth ports 205, 207, 209 and 211 are provided on the housing 201 for connection, via coaxial cables, to the various ports within the subscriber's premises, e.g., the wall ports. The second, third, fourth and fifth ports 205, 207, 209 and 211 are provided for transmitting and receiving in-home network signals, e.g., MoCA signals, allowing customer devices within the in-home network to communication with each other and with the first port 203, connected to the device 11 of FIG. 2. The second, third, fourth and fifth ports 205, 207, 209 and 211 are also provided in the form of female coaxial ports.

The second, third, fourth and fifth ports 205, 207, 209 and 211 do not output service provider signals, e.g., downstream CATV signals, to customer devices and do pass customer device signals in the CATV range, e.g., upstream CATV signals, to the service provider.

The housing 201 also includes a test port 213. The test port 213 can receive signals from and send signals to the second, third, fourth and fifth ports 205, 207, 209 and 211 with less than a 30 db signal loss, such as less than a 20 db signal loss. The test port 213 can receive signals from and send signals to the first port 201 with greater than a 30 db signal loss, such as greater than a 40 db signal loss. The test port 213 may be used by a technician to troubleshoot the in-home network and verify the signal strengths of the various customer devices attached to the in-home network.

In a preferred embodiment, the test port 213 has a different mating configuration than the first, second, third, fourth and fifth ports 203, 205, 207, 209 and 211. For example, FIG. 3 illustrates the test port 213 as a female socket for a ¼ inch plug. The technician would carry signal testing/monitoring equipment with a male ¼ plug connector. By making the test port 213 different from the first, second, third, fourth and fifth ports 203, 205, 207, 209 and 211, confusion can be avoided in that a customer will not be able to inadvertently connect a male coaxial connector associated with a customer device to the test port, mistaking it for a MoCA port.

Figure 4:
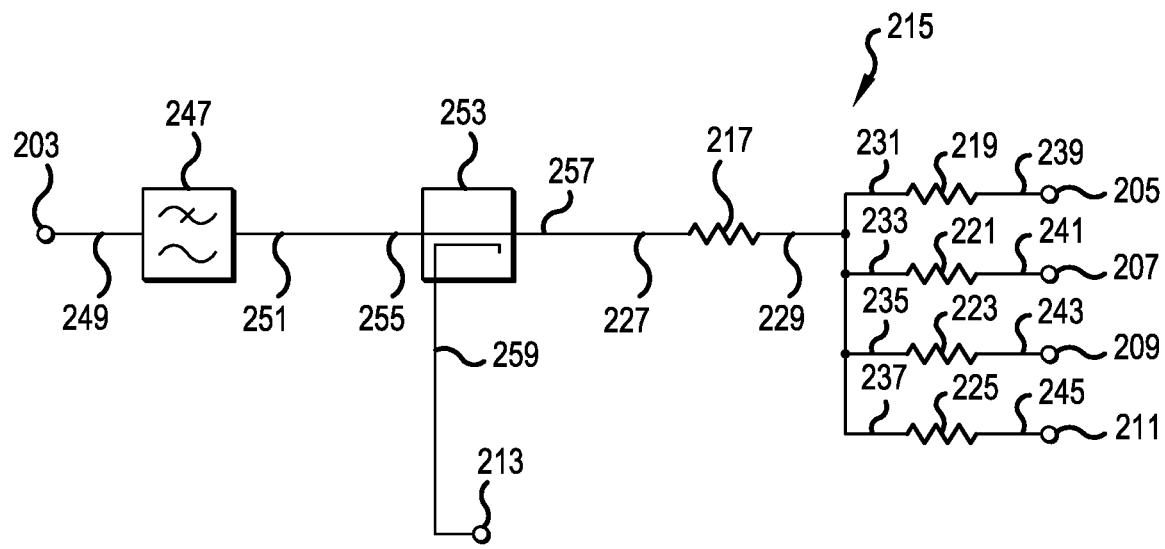
FIG. 4 is a high level schematic of the circuitry within the housing of FIG. 3.

FIG. 4 is a high level electrical schematic of the circuitry contained within the housing 201 of FIG. 3. The circuitry includes a resistive splitter network 215 including a plurality of resistors. The plurality of resistors are interconnected to freely pass MoCA signals between the first, second, third, fourth and fifth ports 203, 205, 207, 209 and 211. The resistive splitter network 215 includes first, second, third, fourth and fifth resistors 217, 219, 221, 223 and 225. A first terminal 227 of the first resistor 217 is connected to the first port 203, albeit with one or more intervening circuit elements. A second terminal 229 of the first resistor 217 is connected to first terminals 231, 233, 235 and 237 of each of the second, third, fourth and fifth resistors 219, 221, 223 and 225, respectively, with no intervening circuit element. Second terminals 239, 241, 243 and 245 of each of the second, third, fourth and fifth resistors 219, 221, 223 and 225 are connected to the second, third, fourth and fifth ports 205, 207, 209 and 211, respectively, with no intervening circuit element.

In a preferred embodiment, the resistive values of the first, second, third, fourth and fifth resistors 217, 219, 221, 223 and 225 are equal, or at least approximately equal. For example, the resistive value may be a fixed value in the range of 30 ohms to 80 ohms, such as in the range of 40 to 70 ohms. In a preferred embodiment the resistors are all set to a value between about 50 to about 60 ohms, such as about 53 ohms.

The circuitry of FIG. 4 also includes a filter 247 interposed between the first port 203 and the resistive splitter network 215. The filter 247 passes frequencies in a MoCA frequency range and does not pass frequencies below a MoCA frequency range. In a preferred embodiment, the MoCA frequency range is about 400 MHz to about 1,675 MHz, which takes advantage of the entire MoCA frequency range afforded by the MoCA standards. However, the MoCA frequency range can be abbreviated to reside between about 1,125 MHz to about 1,675 MHz, if desired. The filter 247 may be formed as a high pass filter to attenuate frequencies below the MoCA band. Alternatively, the filter 247 may be formed as a band pass filter to pass only frequencies within the MoCA band, so as to attenuate both low and high frequency noise within the in-home network.

A first terminal 249 of the filter 247 is directly connected to the first port 203 without any intervening circuit element. A second terminal 251 of the filter 247 is connected to the first terminal 227 of the first resistor 217, albeit with one or more intervening circuit elements.

The circuitry of FIG. 4 also includes a directional coupler 253 interposed between the first port 203 and the resistive splitter network 215. A first leg 255 of the directional coupler 253 is directly connected to the second terminal 251 of the filter 247 without any intervening circuit element. A second leg 257 of the directional coupler 253 is directly connected to the first terminal 227 of the first resistor 217 without any intervening circuit element. A third leg 259 of the directional coupler 253 is directly connected to the test port 213 without any intervening circuit element. It should be noted that the serial connection of the filter 247 (closer to the first port 203) and the directional coupler 253 (closer to the resistive splitter network 215) may be reversed, if desired, so that the directional coupler 253 is closer to the first port 203.

The embodiment of FIGS. 3 and 4 enables the first port 203 of the device 200 to be attached to port 15 of the device 11 of FIG. 2, e.g., an active gateway device, a passive gateway device or RF signal amplifier. The CATV signal, which exits the port 15, will be blocked by the filter 247. MoCA signals, which exit the port 15, will freely pass through the filter 247 to communicate with the second, third, fourth and fifth ports 205, 207, 209 and 211. Further, MoCA signals from the second, third, fourth and fifth ports 205, 207, 209 and 211 will freely pass through the filter 247 and exit the first port 203 to communicate with the port 15 of the device 11.

A technician can use the test port 213 to troubleshoot issues within the in-home network. In sampling the in-home network signals, the technician will appreciate that the directional coupler 253 will greatly reduced the signal strength of the signals from the first, second, third, fourth and fifth ports 203, 205, 207, 209 and 211, as seen at the test port 213. For example, the directional coupler 253 may provide 10 db to 30 db of signal attenuation between the test port 213 and the second, third, fourth and fifth ports 205, 207, 209 and 211, such as 20 db to 25 db. Also, the directional coupler 253 may provide 30 db to 60 db of signal attenuation between the test port 213 and the first port 203, such as 40 db to 50 db. In other words, the directional coupler 253 redirects a very small percentage of the signal strength to the test port 213, which results in very low attention between the first port 203 and the resistive splitter network 215, such as less than 3 db, less than 2 db, or even less than 1 db, such as about a 0.5 db loss.

Figure 5:
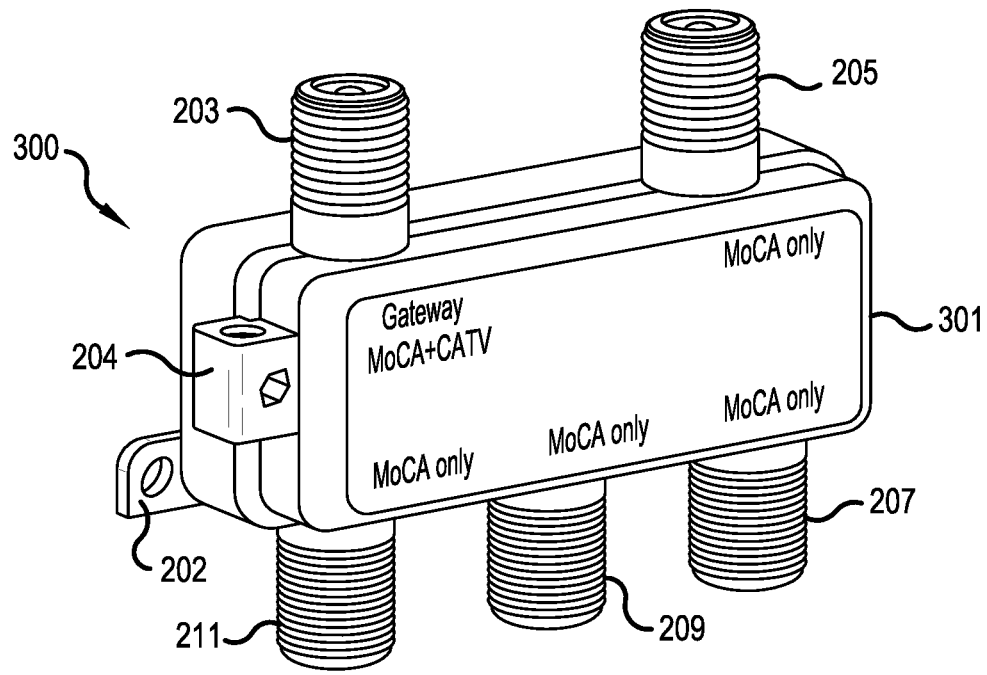
FIG. 5 is a perspective view of a housing of a passive in-home network device, in accordance with a second embodiment of the present invention.

The test port 213 is an optional feature, and other embodiments of the present invention do not require the test port 213. For example, FIG. 5 is a perspective view of a passive in-home network device 300 in accordance with a second embodiment of the present invention. The device 300 includes a housing 301. The housing 301 is identical to the housing 201 of FIG. 3 except for the absence of the test port 213.

Like the device 200, the first port 203 of the device 300 is provided for attachment to a RF/MoCA port of an RF signal amplifier device, active gateway device or passive gateway device. For example, the first port 203 may be connected to one of ports 15 or 17 of the device 11 of FIG. 2 by a coaxial cable.

Figure 6:
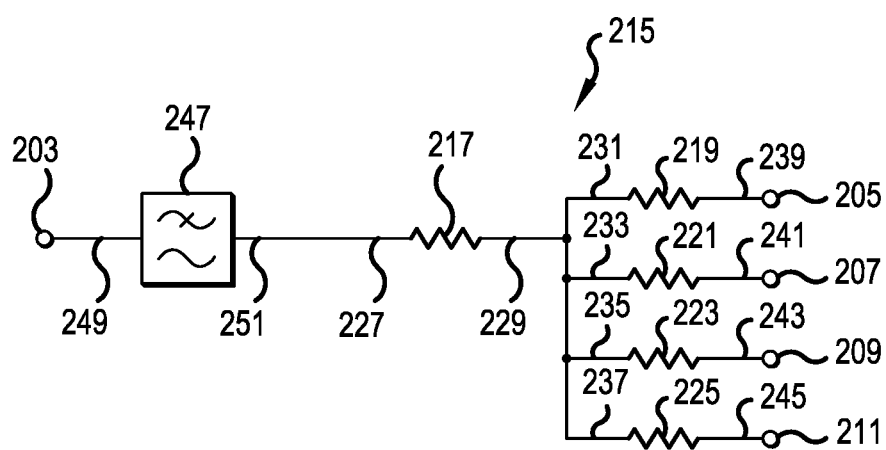
FIG. 6 is a high level schematic of the circuitry within the housing of FIG. 5.

FIG. 6 is a high level electrical schematic of the circuitry contained within the housing 301 of FIG. 5. The circuitry of FIG. 6 is identical to the circuitry of FIG. 4, except for the absence of the directional coupler 253, with its first, second and third legs 255, 257 and 259, and the absence of the test port 213.

In the circuitry of FIG. 6, the second terminal 251 of the filter 247 is directly connected to the first terminal 227 of the first resistor 217 without any intervening circuit element. The device 300 functions the same as the device 200, described in conjunction with FIGS. 3-4, except for the absence of the test port features.

Figure 7:
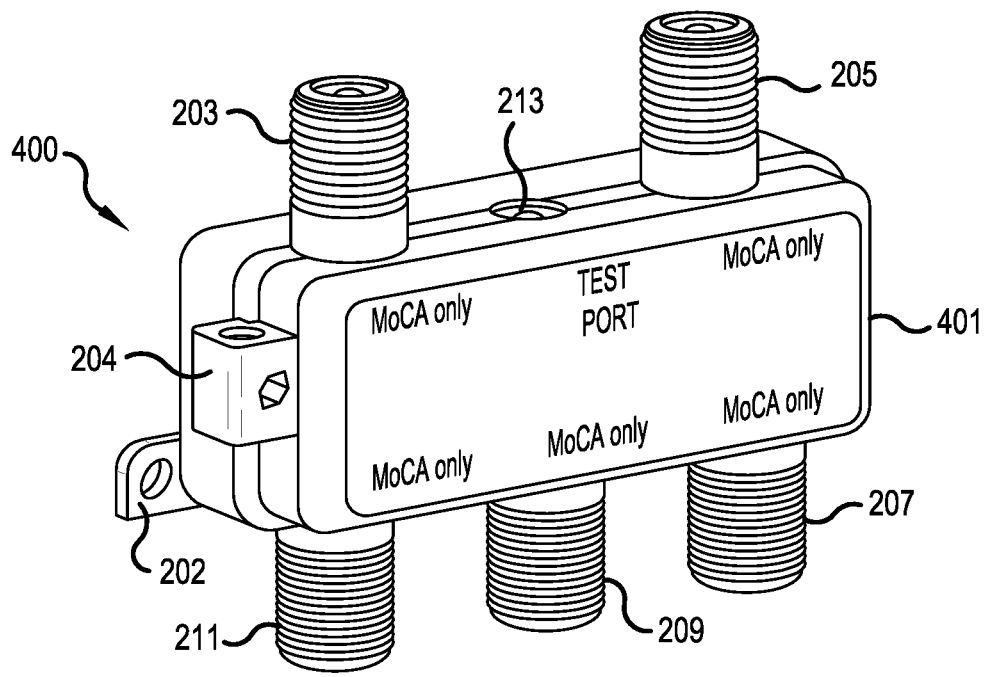
FIG. 7 is a perspective view of a housing of a passive in-home network device, in accordance with a third embodiment of the present invention.

FIG. 7 is a perspective view of a passive in-home network device 400 in accordance with a third embodiment of the present invention. The device 400 includes a housing 401, identical to the housing 201 shown in FIG. 3, except for the labeling of the first port 203.

Unlike the device 200 of FIG. 3, the first port 203 of the device 400 is provided for attachment to a "MoCA Only" port of an RF signal amplifier device, active gateway device or passive gateway device. For example, the first port 203 may be connected to port 19 of the device 11 of FIG. 2 by a coaxial cable.

Figure 8:
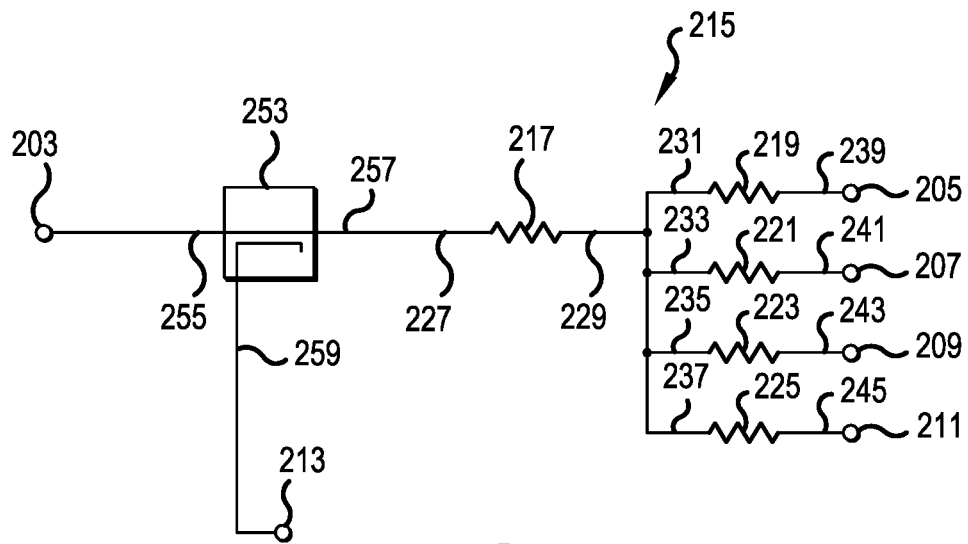
FIG. 8 is a high level schematic of the circuitry within the housing of FIG. 7.

FIG. 8 is a high level electrical schematic of the circuitry contained within the housing 401 of FIG. 7. The circuitry of FIG. 8 is identical to the circuitry of FIG. 4 except for the absence of the filter 247 with its first and second terminals 249 and 251.

In the circuitry of FIG. 8, the first leg 255 of the directional coupler 253 is directly connected to the first port 203 without any intervening circuit element. The device 400 functions the same as the device 200, described in conjunction with FIGS. 3-4, except that the device 400 has no way to filter out frequencies outside of the MoCA band. The device 400 therefore depends upon a filter internal to the device 11 of FIG. 2 to filter out the frequencies outside of the MoCA band. In other words, the first port 203 must be connected to a "MoCA only" port of the device 11 of FIG. 2, and not one of the RF/MoCA ports, e.g., ports 15 and 17.

Figure 9:
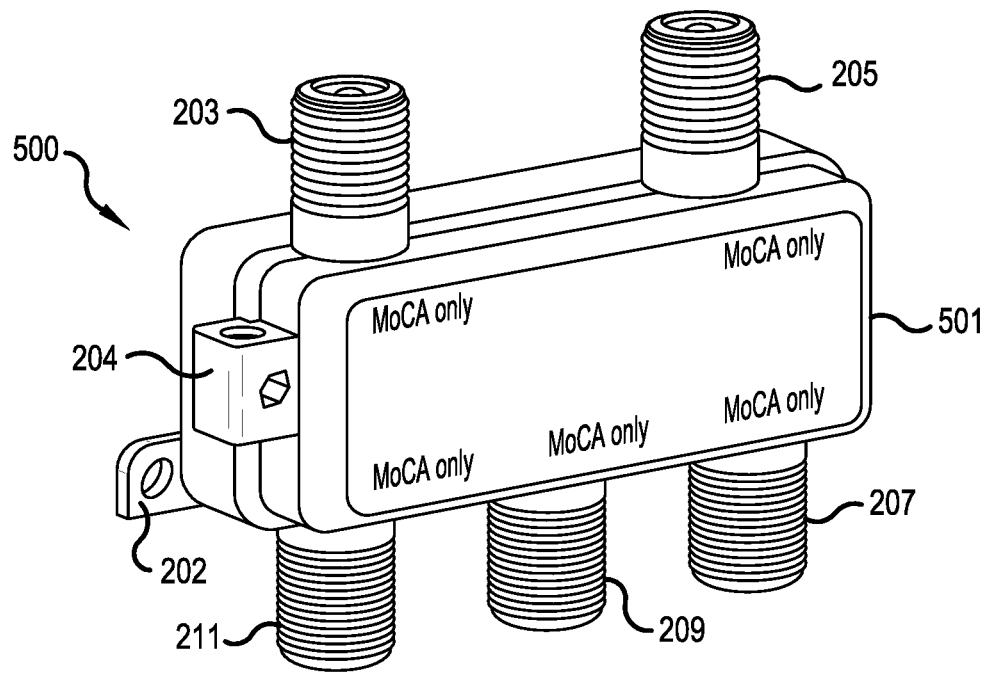
FIG. 9 is a perspective view of a housing of a passive in-home network device, in accordance with a fourth embodiment of the present invention.

FIG. 9 is a perspective view of a passive in-home network device 500 in accordance with a fourth embodiment of the present invention. The device 500 includes a housing 501, identical to the housing 301 shown in FIG. 5, except for the labeling of the first port 203.

Unlike the device 300 of FIG. 5, the first port 203 of the device 500 is provided for attachment to a "MoCA Only" port of an RF signal amplifier device, active gateway device or passive gateway device. For example, the first port 203 may be connected to port 19 of the device 11 of FIG. 2 by a coaxial cable.

Figure 10:
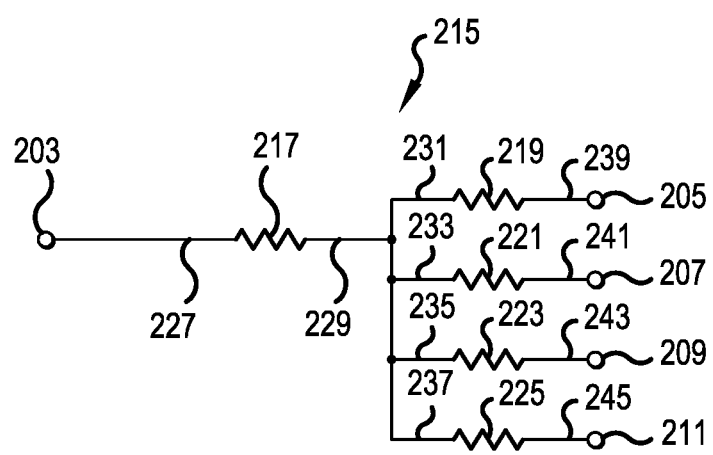
FIG. 10 is a high level schematic of the circuitry within the housing of FIG. 9.

FIG. 10 is a high level electrical schematic of the circuitry contained within the housing 501 of FIG. 9. The circuitry of FIG. 10 is identical to the circuitry of FIG. 6 except for the absence of the filter 247 with its first and second terminals 249 and 251.

In the circuitry of FIG. 10, the first terminal 227 of the first resistor 217 is directly connected to the first port 203 without any intervening circuit element. The device 500 functions the same as the device 300, described in conjunction with FIGS. 5-6, except that the device 500 has no way to filter out frequencies outside of the MoCA band. The device 500 therefore depends upon a filter internal to the device 11 of FIG. 2 to filter out the frequencies outside of the MoCA band. In other words, the first port 203 must be connected to a "MoCA only" port of the device 11 of FIG. 2 and not one of the RF/MoCA ports, e.g., ports 15 and 17.

Figure 11:
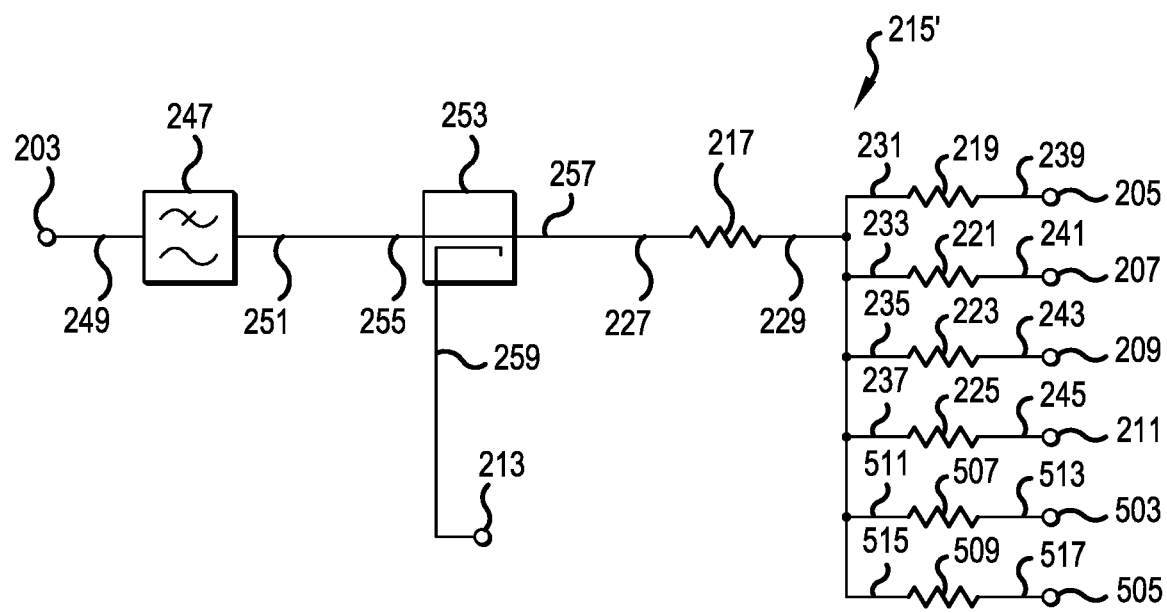
FIG. 11 is a high level schematic of the circuitry of a passive in-home network device, in accordance with a fifth embodiment of the present invention.

Although the above embodiments have illustrated a device 200, 300, 400 and 500 having five female coaxial ports located on a housing 201, 301, 401 and 501, it would be possible to have more or fewer female coaxial ports. FIG. 11 illustrates the circuitry within a housing to support the provision of seven coaxial ports on a housing, namely first, second, third, fourth, fifth, sixth and seventh ports 203, 205, 207, 209, 211, 503 and 505.

The circuitry of FIG. 11 is identical to the circuitry of FIG. 4 except for the addition of sixth and seventh resistors 507 and 509. A first terminal 511 of the sixth resistor 507 is directly connected to the second terminal 229 of the first resistor 217 without any intervening circuit element. A second terminal 513 of the sixth resistor 507 is directly connected to the sixth port 503 without any intervening circuit element. A first terminal 515 of the seventh resistor 509 is directly connected to the second terminal 229 of the first resistor 217 without any intervening circuit element. A second terminal 517 of the seventh resistor 509 is directly connected to the seventh port 505 without any intervening circuit element. The circuitry of FIG. 11 functions the same as the circuitry of FIG. 4, except that the circuitry now supports a device with seven coaxial ports instead of five coaxial ports.

Although the above embodiments have illustrated a device 200, 300, 400 and 500 for connection to a port of a gateway or RF signal amplifier, such as the device 11 shown in FIG. 2, the above embodiments are useful when not attached to such a device. For example, each of the above embodiments could have one, some or all of its ports attached to MoCA ports of customer devices within the in-home network. In such situations, the devices 200, 300, 400 and 500 would function as a hub. The devices 200, 300, 400 and 500 allow MoCA signaling between multiple customer devices. For example, a monitor in one room could watch content from a DVD player in another room, video from a security camera could be displayed on a monitor, a gaming device in one room could be linked to a gaming device in another room, etc. When the device functions as a MoCA hub, the devices 400 and 500, which lack the filter 247, are particularly well suited, since no upstream/downstream CATV signal needs to be filtered out of the MoCA signaling.

One advantage of the present invention is the simple and cost effective design of the devices 200, 300, 400 and 500. The devices 200, 300, 400 and 500 have small housings, as compared to the much larger housings of the prior art devices, such as shown in FIG. 1. The circuitry is simple in design, low cost and introduces minimal signal losses. The devices are passive, e.g., do not require a power source. The lack of signal amplifiers and power dividers, like power dividers 171-177 in FIG. 1, reduces the costs of the devices 200, 300, 400 and 500.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. A passive in-home network device comprising:
a housing;
first, second, third and fourth female coaxial ports located on said housing; and
a resistive splitter network including a plurality of resistors, interconnected to freely pass MoCA signals between said first, second, third and fourth female coaxial ports, wherein said plurality of resistors includes first, second, third and fourth resistors, a first terminal of said first resistor being connected to said first female coaxial port, a second terminal of said first resistor being connected to a first terminal of each of said second, third and fourth resistors, and a second terminal of each of the second, third and fourth resistors being connected to said second, third and fourth female coaxial ports, respectively, wherein said first terminal of said first resistor is directly connected to said first female coaxial port without any intervening circuit element.

2. The passive in-home network device according to claim 1, further comprising:
a fifth female coaxial port, wherein said plurality of resistors further includes a fifth resistor, said second terminal of said first resistor being connected to a first terminal of said fifth resistor, and a second terminal of said fifth resistor being connected to said fifth female coaxial port.

3. The passive in-home network device according to claim 2, wherein said second terminals of said second, third, fourth and fifth resistors are directly connected to said second, third, fourth and fifth female coaxial ports, respectively, without any intervening circuit elements.

4. The passive in-home network device according to claim 1, wherein resistive values of said first, second, third and fourth resistors are equal.

5. The passive in-home network device according to claim 1, wherein resistive values of said first, second, third and fourth resistors are between 30 ohms to 70 ohms.

6. The passive in-home network device according to claim 3, wherein said passive in-home network device consists essentially of said housing,
said first, second, third, fourth and fifth female coaxial ports,
and said first, second, third, fourth and fifth resistors.

7. A passive in-home network device comprising:
a housing;
first, second, third and fourth female coaxial ports located on said housing;
a resistive splitter network including a plurality of resistors, interconnected to freely pass MoCA signals between said first, second, third and fourth female coaxial ports, wherein said plurality of resistors includes first, second, third and fourth resistors, a first terminal of said first resistor being connected to said first female coaxial port, a second terminal of said first resistor being connected to a first terminal of each of said second, third and fourth resistors, and a second terminal of each of the second, third and fourth resistors being connected to said second, third and fourth female coaxial ports, respectively; and
a test port interposed between said first female coaxial port and said resistive splitter network.

8. The passive in-home network device according to claim 7, further comprising:
a directional coupler interposed between said first female coaxial port, said resistive splitter network and said test port, wherein a first leg of said directional coupler is directly connected to said first female coaxial port without any intervening circuit element, a second leg of said directional coupler is directly connected to said first terminal of said first resistor without any intervening circuit element, and a third leg of said directional coupler is directly connected to said test port without any intervening circuit element.

9. The passive in-home network device according to claim 8, wherein said test port can receive signals from said second, third and fourth female coaxial ports with less than a 30 db signal loss, wherein said test port can receive signals from said first female coaxial port with greater than a 30 db signal loss, and wherein said first terminal of said directional coupler communicates signals with said second leg of said directional coupler with less than a 2 db signal loss.

10. The passive in-home network device according to claim 7, wherein said test port has a different mating configuration than said first, second, third and fourth female coaxial ports.

11. The passive in-home network device according to claim 10, wherein said test port is configured as a female socket for a ¼ inch plug.

12. The passive in-home network device according to claim 7, further comprising:

a filter interposed between said first female coaxial port and said resistive splitter network.

13. The passive in-home network device according to claim 12, wherein a first terminal of said filter is directly connected to said first female coaxial port without any intervening circuit element, a second terminal of said filter is directly connected to a first leg of a directional coupler without any intervening circuit element, a second leg of said directional coupler is directly connected to said first terminal of said first resistor without any intervening circuit element, and a third leg of said directional coupler is directly connected to said test port without any intervening circuit element.

14. The passive in-home network device according to claim 12, wherein said filter passes frequencies in a MoCA frequency range and does not pass frequencies below a MoCA frequency range.

15. The passive in-home network device according to claim 14, wherein the MoCA frequency range is about 400 MHz to about 1,675 MHz.

16. The passive in-home network device according to claim 12, wherein a first terminal of said filter is directly connected to said first port without any intervening circuit element.

17. The passive in-home network device according to claim 12, wherein said filter is a high pass filter or a band pass filter.

18. A passive in-home network device consisting essentially of:
   a housing;
   first, second, third, fourth and fifth female coaxial ports located on said housing;
   a resistive splitter network including a plurality of resistors, interconnected to freely pass MoCA signals between said first, second, third, fourth and fifth female coaxial ports;
   a filter interposed between said first female coaxial port and said resistive splitter network; and
   a directional coupler and test port interposed between said first female coaxial port and said resistive splitter network, wherein said plurality of resistors includes first, second, third, fourth and fifth resistors, a first terminal of said first resistor being connected to said first female coaxial port with said filter and directional coupler being connected in series between said first terminal of said first resistor and said first female coaxial port, a second terminal of said first resistor being connected to a first terminal of each of said second, third, fourth and fifth resistors without any intervening circuit element, and a second terminal of each of the second, third, fourth and fifth resistors being connected to said second, third, fourth and fifth female coaxial ports, respectively, without any intervening circuit element, wherein a terminal of said directional coupler is connected to said test port.

19. The passive in-home network device according to claim 18, wherein said filter passes frequencies in a MoCA frequency range and does not pass frequencies below a MoCA frequency range.

20. The passive in-home network device according to claim 19, wherein the MoCA frequency range is about 400 MHz to about 1,675 MHz.

* * * * *